(12) United States Patent
Basker et al.

(10) Patent No.: US 7,501,345 B1
(45) Date of Patent: Mar. 10, 2009

(54) SELECTIVE SILICIDE FORMATION BY ELECTRODEPOSIT DISPLACEMENT REACTION

(75) Inventors: Veeraraghaven S. Basker, Schenectady, NY (US); Hariklia Deligianni, Tenafly, NJ (US); Balasubramanian S. Pranatharthi Haran, Watervilet, NY (US); James J. Kelly, Schenectady, NY (US); Christian Lavoie, Pleasantville, NY (US); George G. Totir, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/057,688

(22) Filed: Mar. 28, 2008

(51) Int. Cl.
   *H01L 21/44* (2006.01)
(52) U.S. Cl. ............... 438/682; 438/678; 257/E21.476
(58) Field of Classification Search ................ 438/678, 438/682; 257/E21.476
   See application file for complete search history.

(56) References Cited

U.S. PATENT DOCUMENTS

| | | | |
|---|---|---|---|
| 4,109,030 A | | 8/1978 | Briska et al. |
| 5,017,516 A | * | 5/1991 | van der Putten ............ 438/675 |
| 5,358,907 A | | 10/1994 | Wong |
| 5,372,701 A | * | 12/1994 | Gerdon et al. ............... 205/210 |
| 6,391,477 B1 | * | 5/2002 | Koslov et al. ............... 428/670 |
| 6,486,055 B1 | * | 11/2002 | Jung et al. .................. 438/618 |
| 6,899,816 B2 | * | 5/2005 | Padhi et al. .................... 216/52 |
| 2003/0070690 A1 | * | 4/2003 | Danese ........................ 134/1.3 |

OTHER PUBLICATIONS

Weichun Ye, Yanlong Chang, Chuanli, Bingyu Jia, Guiyan Cao, Chunming Wang, "Electrochemical Investigation of the Surface Energy: Effect of the HF Concentration on Electroless Silver Deposition onto p-SI (1 1 1)", Science Direct, 2006, 6 pages. Elsevier B.V.
Yee-Shyi Chang, Mei-Ling Chou, "Amorphous Film Growth of Electroless Osmium Deposition on Silicon Single Crystal Studied by an Analytical Scanning Transmission Electron Microscope", Materials Chemistry and Physics, 1989, 131-145, 24 Elsevier Sequoia, The Netherlands.
Guangming Li, Jun Jiao, Supapan Seraphin, and Srini Raghavan, "Masking Effect of Copper During Anisotropic Etching of Silicon in Buffered Hydrofluoric Acid Solutions", Journal of Applied Physics, 1999, 1857-1863, vol. 85, No. 3 American Institute of Physics.

(Continued)

*Primary Examiner*—Charles D. Garber
*Assistant Examiner*—Angel Roman
(74) *Attorney, Agent, or Firm*—Cantor Colburn LLP; Robert Trepp

(57) ABSTRACT

Silicide formation processes are disclosed that use an electrochemical displacement reaction in the absence of an externally applied current or potential. In an embodiment, a method for forming an integrated circuit comprises: depositing a metallic material upon select areas of a semiconductor topography comprising silicon by contacting the semiconductor topography with an aqueous solution comprising an acid and a metal salt to cause an electrochemical displacement reaction in the absence of an externally applied current or potential, wherein a concentration of the metal salt in the aqueous solution is about 0.01 millimolar to about 0.5 millimolar; and annealing the metallic material to form a silicide upon the areas of the semiconductor topography comprising the silicon.

4 Claims, 3 Drawing Sheets

OTHER PUBLICATIONS

P. Gorostiza, J. Servat, J.R. Morante, F. Sanz, "First Stages of Platinum Electroless Deposition on Silicon (100) from Hydrogen Fluoride Solutions Studied by AFM", Thin Solid Films, 1996, 12-17, vol. 275 (1), Elsevier Science S.A.

D. Martin Knotter, "Etching Mechanism of Vitreous Silicon Dioxide in HF-Based Solutions", Apr. 25, 2000, 4345-4351, American Chemical Society, The Netherlands.

* cited by examiner

SELECTIVE SILICIDE FORMATION BY ELECTRODEPOSIT DISPLACEMENT REACTION

BACKGROUND OF THE INVENTION

1. Field of the Invention

This invention relates to integrated circuits, and particularly to selective silicide formation using an electrochemical displacement reaction in the absence of an externally applied current or potential.

2. Description of Background

Integrated circuits often employ active devices known as transistors such as field effect transistors (FETs). A FET includes a silicon-based substrate comprising a pair of impurity regions, i.e., source and drain junctions, spaced apart by a channel region. A gate conductor is dielectrically spaced above the channel region of the silicon-based substrate. The junctions can comprise dopants which are opposite in type to the dopants residing within the channel region interposed between the junctions. The gate conductor can comprise a doped semiconductive material such as polycrystalline silicon ("polysilicon"). The gate conductor can serve as a mask for the channel region during the implantation of dopants into the adjacent source and drain junctions. An interlevel dielectric can be disposed across the transistors of an integrated circuit to isolate the gate areas and the junctions. Ohmic contacts can be formed through the interlevel dielectric down to the gate areas and/or junctions to couple them to overlying interconnect lines.

To reduce the contact resistances at the interfaces of the gate and the source and drain junctions, metal silicide structures can be formed between the ohmic contacts and the gate/junctions. FIGS. 1-4 illustrate a current process for forming such metal silicide structures. In FIG. 1, a FET is depicted that includes a portion of a silicon-based substrate 10 isolated from other regions of the substrate by shallow trench isolation structures 20 comprising a dielectric. A polysilicon gate 30 is spaced above the substrate 10 by a gate dielectric (not shown). Dielectric spacers 40 are formed upon the sidewalls of the gate 30. Source/drain junctions 50 are disposed in the substrate 10 on opposite sides of the gate 30/spacers 40. As shown in FIG. 2, the formation of the metal silicide first involves using a nonselective, vacuum deposition method, e.g., sputtering, to blanket deposit a metal film 60 across the semiconductor topography from FIG. 1. As shown in FIG. 3, the deposited metal film 60 can then be annealed to react the metal only in regions where silicon atoms are present while regions bearing no active silicon, e.g. dielectric regions, remain unreacted. In this manner, self-aligned metal silicide structures 70 can be formed exclusively upon the source/drain junctions 50 and the polysilicon gate 30. As illustrated in FIG. 4, the excess, unreacted metal 60 can be removed using a wet chemical etch. Removing the metal in this manner can undesirably damage the silicide if the wet etch process is not carefully controlled.

SUMMARY OF THE INVENTION

The shortcomings of the prior art are overcome and additional advantages are provided through the provision of a selective silicide formation process performed using an electrochemical displacement reaction in the absence of an externally applied current or potential. In an embodiment, a method for forming an integrated circuit comprises: depositing a metallic material upon select areas of a semiconductor topography comprising silicon by contacting the semiconductor topography with an aqueous solution comprising an acid and a metal salt to cause an electrochemical displacement reaction in the absence of an externally applied current or potential, wherein a concentration of the metal salt in the aqueous solution is about 0.01 millimolar to about 0.5 millimolar; and annealing the metallic material to form a silicide upon the areas of the semiconductor topography comprising the silicon.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

A method is described for forming metal silicide selectively upon silicon-based regions of a semiconductor topography via an electrochemical displacement reaction in which metal ions in solution displace silicon atoms on the semiconductor topography. As a result of the electrochemical displacement reaction, a metallic material can be deposited only on the areas of the semiconductor topography comprising silicon and not on insulating areas. The metallic material can then be annealed to convert it to metal silicide. Since no metal is electrodeposited on the insulating areas, a wet chemical etch, which would be required to remove unconverted metal from those areas, is no longer necessary, thus avoiding the negative side effect of potential damage to the silicide layer. In contrast to other currently used methods of forming silicide, this method does not require a mask to prevent the metallic material from depositing on the insulating areas. Further, it does not require a current or potential to be applied to the substrate to drive the electrodeposition reaction. Otherwise, silicon-based areas that are electrically isolated from the substrate would not receive the deposited metal, as in the case of silicon on insulator (SOI) substrates where the logic devices are isolated from one another. The use of the electrochemical displacement reaction thus simplifies the process of forming the metal silicide and ensures that all areas of the substrate comprising active silicon receive the deposited metal.

Figure 1:
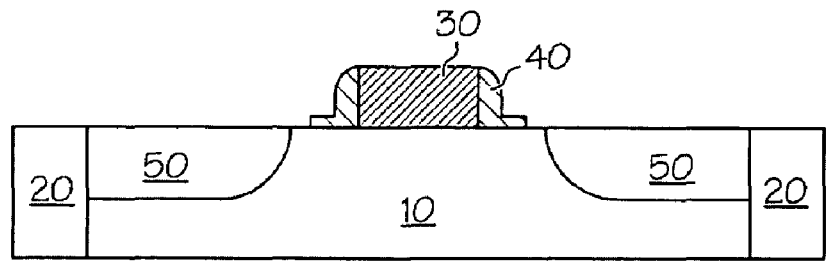
FIGS. 1-4 depict a cross-sectional view of a transistor upon which silicide structures are formed in accordance with a prior art process.
Figure 2:
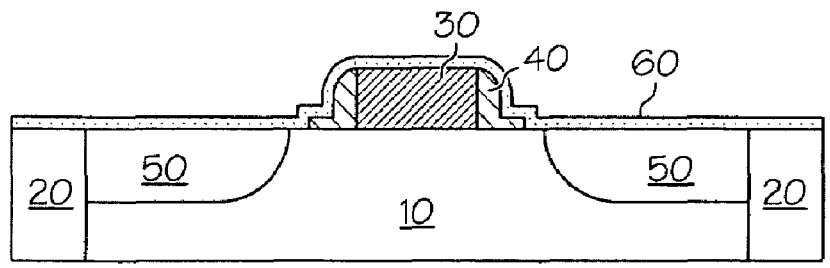
Figure 3:
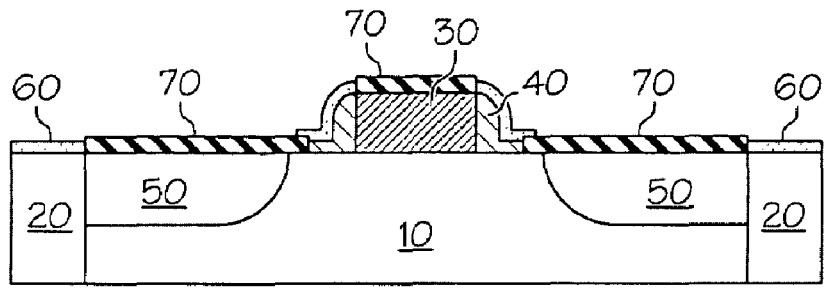
Figure 4:
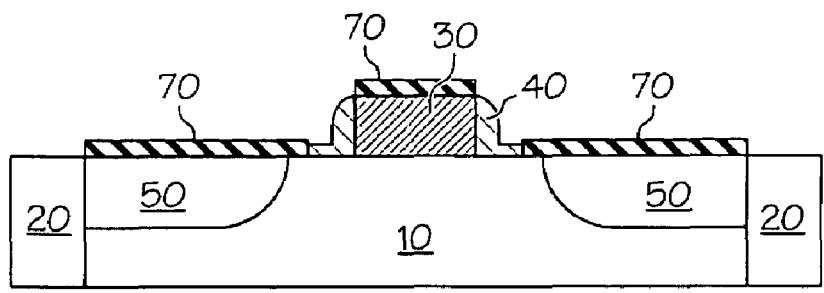
Figure 5:
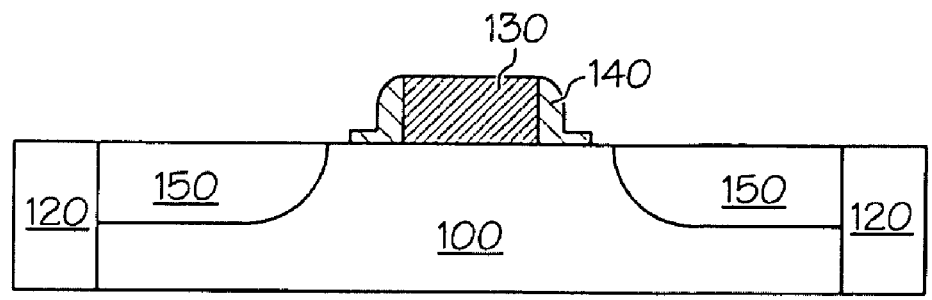
FIGS. 5-7 depict a cross-sectional view of a transistor upon which silicide structures are formed in accordance with an embodiment described herein.
Figure 6:
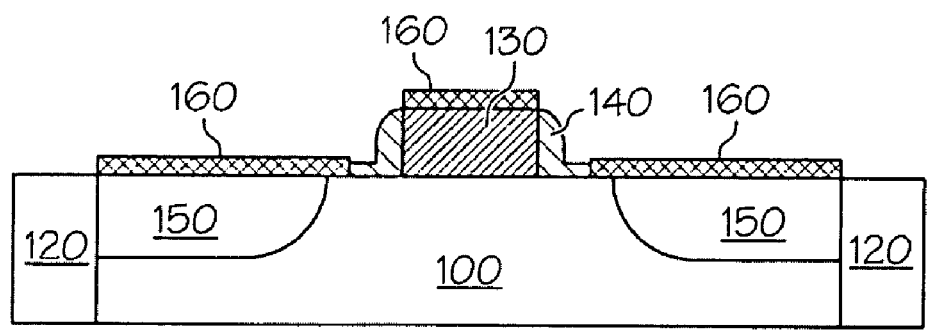
Figure 7:
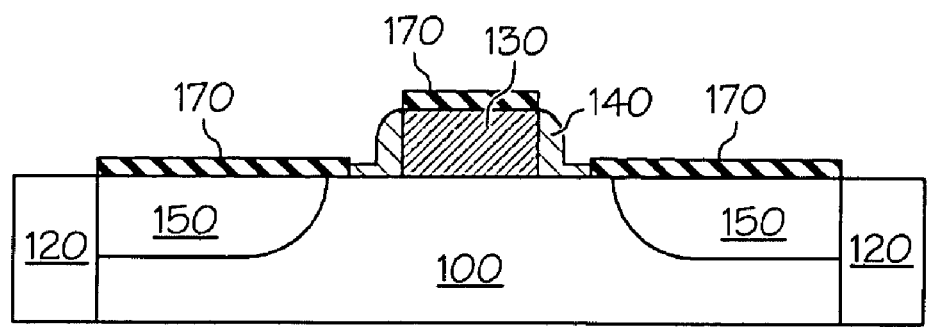

FIGS. 5-7 illustrate an exemplary embodiment of a method for forming metal silicide upon a transistor using an electrochemical displacement reaction. As depicted in FIG. 5, the transistor can include a substrate 100 comprising single crystalline silicon which has been slightly doped with n-type or p-type dopants. Shallow trench isolation structures 120 can be arranged adjacent to both sides of the transistor to isolate it from other active areas. A polysilicon gate 130 is spaced from the upper surface of the substrate 100 by a gate dielectric (not shown) such as silicon dioxide ("oxide"). A pair of dielectric (e.g., oxide) spacers 140 has been formed upon the opposed sidewall surfaces of the gate 130. Source/drain junctions 150 comprising n-type or p-type dopants can be placed in the substrate 100 on opposite sides of the dielectric spacers 140. In the case of a NFET, the source/drain junctions 150 can be implanted with n-type dopants, whereas in the case of a PFET, the source/drain junctions 150 can be implanted with p-type dopants. Examples of n-type dopants include, but are not limited to, arsenic and phosphorus, and examples of p-type dopants include, but are not limited to, boron and boron difluoride. It is to be understood that both NFET and PFET devices can be formed within a unitary substrate to form a CMOS (complementary metal-oxide semiconductor) circuit.

As shown in FIG. 6, a metallic material 160 can be selectively deposited upon the upper surfaces of the gate 130 and the junctions 150 by an electrochemical displacement reaction, which provides better coverage of the underlying surfaces than would electroless or electroplating deposition. As used herein, "metallic" refers to any material comprising metal including pure metals and alloys of metals. Examples of suitable metallic materials include, but are not limited to, noble metals that are resistant to oxidation such as nickel, cobalt, platinum, ruthenium, rhodium, and iridium, and combinations comprising at least one of the foregoing metals.

The displacement reaction can be caused by contacting, e.g., by immersion, the semiconductor topography with an aqueous solution comprising an acid, an electrolyte such as a metal salt of the metal to be deposited, and one or more suitable supporting salts to increase the conductivity of the bath or buffer the solution pH. The acid can dissolve the exposed silicon atoms of the gate 130 and junctions 150 to allow those silicon atoms to be displaced with the metal ions of the solution. The reaction can proceed without an externally applied current or potential and can be performed at room temperature. The semiconductor topography can be contacted with the aqueous solution for a period of time sufficient to deposit a desired thickness of the metallic material 160. For example, 1 to 2 minutes of immersion of the semiconductor topography in the aqueous solution described herein can achieve a film thickness of about 10 nanometers to about 50 nanometers and unexpectedly high nucleation densities. For example, the nucleation density can be about $1 \times 10^{10}$ cm$^{-2}$ to about $1 \times 10^{12}$ cm$^{-2}$, more specifically about $5 \times 10^{10}$ cm$^{-2}$ to about $1 \times 10^{11}$ cm$^{-2}$. The dielectric spacers 140 can serve to prevent the subsequently deposited metal from contacting, and hence reacting with, the polysilicon at the sidewall surfaces of the gate 130. Absent the dielectric spacers 140, metal silicide could form upon the sidewall surfaces of the gate 130, undesirably shorting the gate 130 to the adjacent junctions 150.

Examples of suitable acids for use in the aqueous solution include, but are not limited to, hydrofluoric acid and mixtures of hydrofluoric acid with other acids such as sulfuric acid or nitric acid. The weight ratio of the acid to the water in the solution can range from about 10:1 to about 300:1, more specifically about 50:1 to about 100:1, with higher concentrations of the acid being preferred.

Suitable metal salts for use in the aqueous solution are those dissolvable in the solution. The concentration of the metal salt in the aqueous solution can range from about 0.01 millimolar (mM) to about 100 mM, preferably about 0.01 mM to about 0.5 mM, and even more preferably about 0.01 mM to about 0.1 mM. The lower metal concentrations are preferred because they yield higher nucleation densities for thin metallic films having thicknesses less than about 50 nm, more specifically less than about 10 nm.

Examples of suitable supporting salts for use in the aqueous solution include, but are not limited to, salts that buffer the pH such as ammonium fluoride or other fluoride salts, inert salts for increasing the solution conductivity such as sodium sulfate or other sulfate salts, and combinations comprising at least one of the foregoing salts. Preferred ranges for these salts in the case of pH buffering depend on the amount of hydrofluoric acid used in the bath and the desired pH. For increased bath conductivity, the supporting salt concentration can range from about 0.01 mM to about 1M, more specifically from about 1 mM to about 0.5 M.

After the deposition of the metallic material 160, the semiconductor topography can be annealed to cause the metal atoms of the metallic material 160 to undergo cross-diffusion and reaction with the silicon atoms of the polysilicon gate 130 and the source/drain junctions 150. By way of example, the annealing can be performed in a furnace at, e.g., a temperature of about 400° C. to about 600° C. for a period of, e.g., about 1 hour to about 3 hours. Alternatively, the annealing can be performed using rapid thermal processing (RTP) by exposing the semiconductor topography to an arc lamp or a tungsten-halogen lamp at, e.g., a temperature of about 600° C. to about 800° C. for a period of, e.g., about 15 seconds to about 60 seconds. As a result of the anneal step, the metallic material 160 can be converted to metal silicide 170 as shown in FIG. 7, thereby lowering the resistivity at the interface between the gate 130/junctions 150 and ohmic contacts subsequently formed upon the metal silicide 170.

Although FIGS. 5-7 illustrate a method for forming metal silicide upon a regular FET device using an electrochemical displacement reaction, it is understood that the method described herein could also be applied to a finFET device. The body of a finFET device is formed from a semiconductor structure referred to as a "fin", which extends vertically above a silicon-based substrate. The gate electrode of a finFET device is formed across a central channel region of the fin, and the source and drain junctions are formed in the fin on opposite sides of the gate electrode. Thus, an electrochemical displacement reaction can be employed to form metal silicide upon the source and drain junctions of the fin structure and the gate electrode located above the fin structure.

EXAMPLES

The following non-limiting examples further illustrate the various embodiments described herein.

Figure 8:
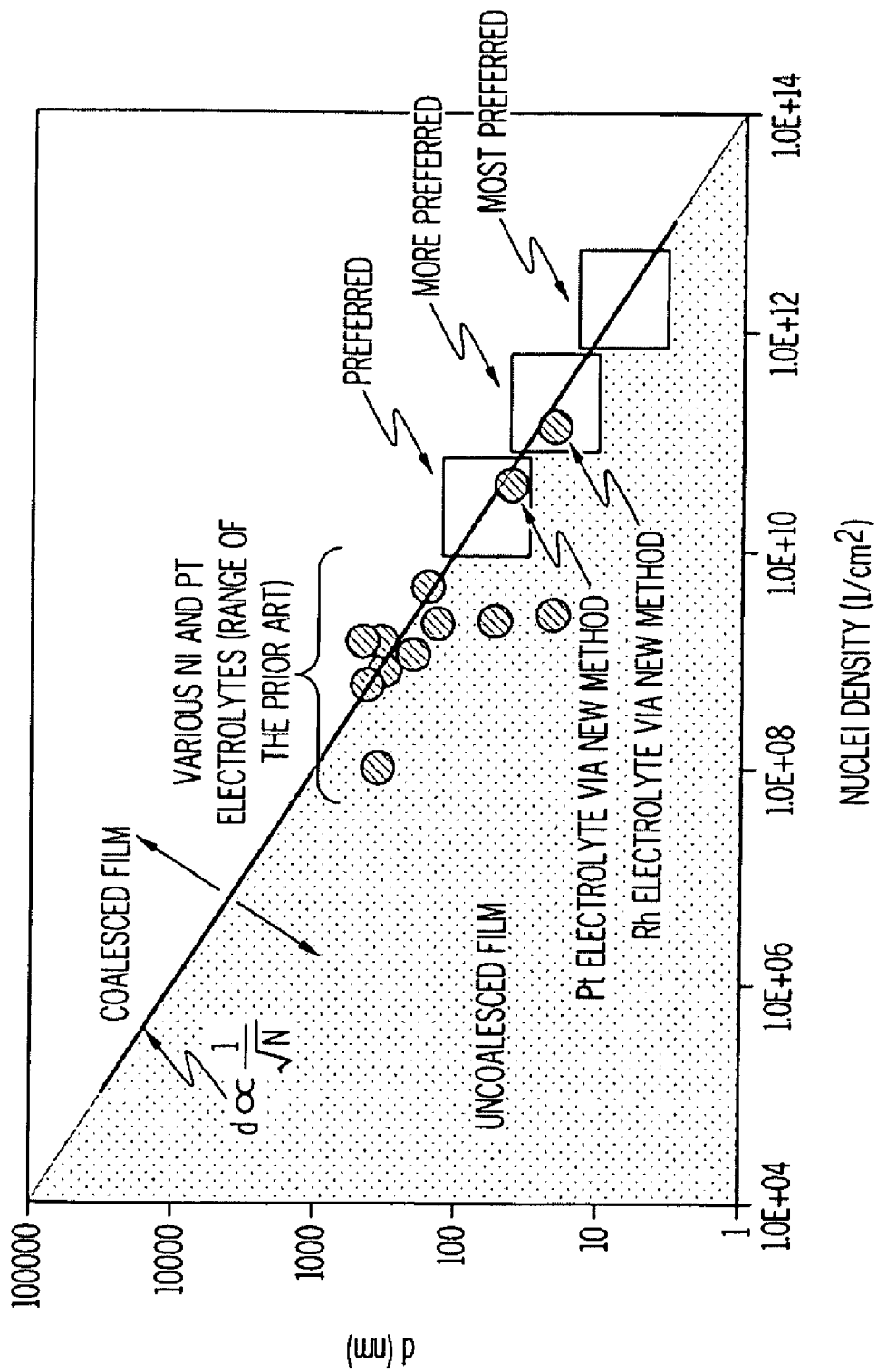
FIG. 8 graphically compares the nucleation densities of metal films deposited by a prior art method to those of metal films deposited in accordance with an embodiment described herein.

FIG. 8 shows the results of experiments performed to deposit metal on silicon using a prior art electrodeposition method and the method disclosed herein which relies on an electrochemical displacement reaction. Silicon coupons were immersed in various electrolyte solutions for 1 to 10 seconds. For the prior art electrodeposition samples, the metal was deposited on the substrate by applying a voltage using an external power supply. For the Pt film formed by an electrochemical displacement reaction, the metal was deposited directly on the silicon coupon from a solution consisting of 0.1 mM Pt ions (from a hydrogen hexachloroplatinate(IV) salt), 0.5 M sulfuric acid, and a quantity of hydrofluoric acid (HF) added to the solution to obtain a volume ratio of HF to solution of 40:1. For the Rh film formed by an electrochemical displacement reaction, the metal was deposited directly on the silicon coupon from a solution consisting of 0.1 mM Rh ions (from a rhodium (III) chloride hydate salt), 0.5 M sulfuric acid, and a quantity of HF added to the solution to obtain a volume ratio of HF to solution of 40:1.

The coupon surface of each sample was then characterized by either top-down scanning electron microscopy (SEM) or atomic force microscopy (AFM) to determine the nuclei densities and sizes. Nuclei densities were calculated by simply counting how many deposited metal nuclei were present in a given area, while the particle size was determined directly from the SEM or AFM image. The nucleation densities of the Pt and Rh films deposited by electrochemical displacement reaction were higher than those of the metals deposited by the prior art method. Moreover, the low Pt and Rh ion content in the solutions described above yielded Pt and Rh films having relatively high nucleation densities.

As used herein, the terms "a" and "an" do not denote a limitation of quantity but rather denote the presence of at least one of the referenced items. Moreover, ranges directed to the same component or property are inclusive of the endpoints given for those ranges (e.g., "about 5 wt % to about 20 wt %," is inclusive of the endpoints and all intermediate values of the range of about 5 wt % to about 20 wt %). Reference throughout the specification to "one embodiment", "another embodiment", "an embodiment", and so forth means that a particular element (e.g., feature, structure, and/or characteristic) described in connection with the embodiment is included in at least one embodiment described herein, and might or might not be present in other embodiments. In addition, it is to be understood that the described elements may be combined in any suitable manner in the various embodiments. Unless defined otherwise, technical and scientific terms used herein have the same meaning as is commonly understood by one of skill in the art to which this invention belongs.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for forming an integrated circuit, comprising: selectively depositing a metallic material without using a mask upon only those areas of a semiconductor topography comprising silicon using an electrochemical displacement reaction in the absence of an externally applied current or potential by contacting the semiconductor topography with an aqueous solution comprising hydrofluoric acid and a metal salt, wherein an entirety of the metallic material used to form the silicide is formed by the electrochemical displacement reaction, wherein the select areas of the semiconductor topography upon which the metallic material is deposited comprise source and drain junctions and a gate electrode, and wherein a concentration of the metal salt in the aqueous solution is about 0.01 millimolar to about 0.5 millimolar;

and annealing the metallic material to form a silicide upon the areas of the semiconductor topography comprising the silicon.

2. The method of claim 1, wherein the aqueous solution further comprises a supporting salt as a buffer present at a concentration of about 0.01 millimolar to about 1 molar.

3. The method of claim 1, wherein the aqueous solution further comprises sulfuric acid, nitric acid, or a combination comprising at least one of the foregoing acids.

4. The method of claim 1, wherein a weight ratio of the acid to water in the aqueous solution is about 10:1 to about 300:1.

* * * * *